(12) United States Patent
Beach

(10) Patent No.: US 8,174,048 B2
(45) Date of Patent: May 8, 2012

(54) III-NITRIDE CURRENT CONTROL DEVICE AND METHOD OF MANUFACTURE

(75) Inventor: Robert Beach, Altadena, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/040,312

(22) Filed: Jan. 21, 2005

(65) Prior Publication Data

US 2005/0194612 A1 Sep. 8, 2005

Related U.S. Application Data

(60) Provisional application No. 60/538,941, filed on Jan. 23, 2004, provisional application No. 60/538,864, filed on Jan. 23, 2004, provisional application No. 60/538,794, filed on Jan. 23, 2004.

(51) Int. Cl.
*H01L 29/66* (2006.01)

(52) U.S. Cl. ........ 257/192; 257/190; 257/194; 257/472; 257/488; 257/745; 257/E21.186; 257/E21.403; 257/E21.407; 257/E21.45; 257/E27.068; 257/E29.041; 257/E29.246; 257/E29.252; 257/E29.253; 257/E29.317

(58) Field of Classification Search .................. 257/194, 257/745, 541, 536, 109, E21.433, E21.421, 257/E21.455, E21.623, E21.637, 192, 196, 257/E29.248, E29.249, E29.251, 267, 183.1, 257/183, E29.252, E29.253, 271, 280, 928, 257/488, 630, 190, 472, E21.186, E21.403, 257/E21.407, E21.45, E27.068, E29.041, 257/E29.246, E29.317

See application file for complete search history.

(56) References Cited

U.S. PATENT DOCUMENTS

| 5,087,950 A | * | 2/1992 | Katano | 257/472 |
| 5,321,284 A | * | 6/1994 | Scott et al. | 257/282 |
| 5,866,925 A | * | 2/1999 | Zolper et al. | 257/279 |
| 6,180,968 B1 | * | 1/2001 | Kasahara et al. | 257/192 |

(Continued)

FOREIGN PATENT DOCUMENTS

JP 2004-22774 1/2004

OTHER PUBLICATIONS

Lindholm et al., Unified Modeling of Field-Effect Devices. IEEE Journal of Solid-State Circuits, vol. SC-6, No. 4, (Aug. 1971) pp. 250-259.*

(Continued)

*Primary Examiner* — Jay C Kim

(74) *Attorney, Agent, or Firm* — Farjami & Farjami LLP

(57) ABSTRACT

A III-nitride device includes a recessed electrode to produce a nominally off, or an enhancement mode, device. By providing a recessed electrode, a conduction channel formed at the interface of two III-nitride materials is interrupted when the electrode contact is inactive to prevent current flow in the device. The electrode can be a schottky contact or an insulated metal contact. Two ohmic contacts can be provided to form a rectifier device with nominally off characteristics. The recesses formed with the electrode can have sloped sides. The electrode can be formed in a number of geometries in conjunction with current carrying electrodes of the device. A nominally on device, or pinch resistor, is formed when the electrode is not recessed. A diode is also formed by providing non-recessed ohmic and schottky contacts through an insulator to an AlGaN layer.

14 Claims, 13 Drawing Sheets

U.S. PATENT DOCUMENTS

| | | | |
|---|---|---|---|
| 6,429,501 B1 * | 8/2002 | Tsuchitani et al. | 257/493 |
| 6,507,051 B1 * | 1/2003 | Hara | 257/194 |
| 6,552,373 B2 * | 4/2003 | Ando et al. | 257/192 |
| 6,555,851 B2 * | 4/2003 | Morizuka | 257/194 |
| 6,656,823 B2 | 12/2003 | Lee | |
| 6,787,820 B2 * | 9/2004 | Inoue et al. | 257/192 |
| 6,933,544 B2 * | 8/2005 | Saito et al. | 257/194 |
| 6,940,090 B2 * | 9/2005 | Saito et al. | 257/20 |
| 7,030,428 B2 * | 4/2006 | Saxler | 257/194 |
| 7,038,252 B2 * | 5/2006 | Saito et al. | 257/192 |
| 7,071,498 B2 * | 7/2006 | Johnson et al. | 257/192 |
| 2001/0034116 A1 | 10/2001 | Lee | |
| 2001/0040247 A1 * | 11/2001 | Ando et al. | 257/192 |
| 2002/0017648 A1 * | 2/2002 | Kasahara et al. | 257/79 |
| 2002/0017696 A1 | 2/2002 | Nakayama et al. | |
| 2002/0052076 A1 * | 5/2002 | Khan et al. | 438/235 |
| 2002/0139995 A1 * | 10/2002 | Inoue et al. | 257/194 |
| 2002/0167023 A1 * | 11/2002 | Chavarkar et al. | 257/194 |
| 2003/0098462 A1 * | 5/2003 | Yoshida | 257/183 |
| 2003/0218183 A1 * | 11/2003 | Micovic et al. | 257/192 |
| 2005/0051796 A1 * | 3/2005 | Parikh et al. | 257/192 |

OTHER PUBLICATIONS

Saito, *Recessed-Gate Structure Approach Toward Normally Off High-Voltage AlGaN/GaN HEMT for Power Electronics Applications*, Feb. 2006, IEEE Transactions on Electron Devices, vol. 53, No. 2.

* cited by examiner

Layer structure with protective insulator on top

III-NITRIDE CURRENT CONTROL DEVICE AND METHOD OF MANUFACTURE

CROSS-REFERENCE TO RELATED APPLICATION

The present application is based on and claims benefit of U.S. Provisional Application No. 60/538,941, filed Jan. 23, 2004, entitled Clamped Impedance Field Effect Rectifier, U.S. Provisional Application No. 60/538,794, filed Jan. 23, 2004, entitled III-Nitride Pinch Resistor, U.S. Provisional Application No. 60/538,864, filed Jan. 23, 2004, entitled III-Nitride Piezoelectric Heterojunction Interdigitated Rectifier, to all of which a claim of priority is hereby made and the disclosure of which is incorporated by reference.

BACKGROUND OF THE INVENTION

1. Field of the Invention

The present invention relates generally to a class of field effect current control devices, and relates more particularly to rectifiers and current limiting devices constructed in the III-Nitride material system.

2. Description of Related Art

III-nitride semiconductors are presently known that exhibit a large dielectric breakdown field of greater than 2.2 MV/cm. III-nitride heterojunction structures are also capable of carrying extremely high currents, which makes devices fabricated in the III-nitride material system excellent for power applications.

Development of devices based on III-nitride materials has generally been aimed at high power-high frequency applications such as emitters for cell phone base stations. The devices fabricated for these types of applications are based on general device structures that exhibit high electron mobility and are referred to variously as heterojunction field effect transistors (HFETs), high electron mobility transistors (HEMTs) or modulation doped field effect transistors (MODFETs). These types of devices are typically able to withstand high voltages such as in the range of 100 Volts, while operating at high frequencies, typically in the range of 2-100 GHz. These types of devices may be modified for a number of types of applications, but typically operate through the use of piezoelectric polarization fields to generate a two dimensional electron gas (2DEG) that allows transport of very high current densities with very low resistive losses. The 2DEG is formed at an interface of AlGaN and GaN materials in these conventional III-nitride HEMT devices. Due to the nature of the AlGaN/GaN interface, and the formation of the 2DEG at the interface, devices that are formed in the III-nitride materials system tend to be nominally on, or depletion mode devices. The high electron mobility of the 2DEG at the interface of the AlGaN/GaN layers permits the III-nitride device, such as a HEMT device, to conduct without the application of a gate potential. The nominally on nature of the HEMT devices previously fabricated have limited their applicability to power management. The limitations of nominally on power devices is observed in the need to have a control circuit be powered and operational, before power can be safely controlled by a III-nitride HEMT device. Accordingly, it would be desirable to create a III-nitride HEMT device that is nominally off to avoid current conduction problems during start-up and other modes.

A drawback of III-nitride HEMT devices that permit high current densities with low resistive losses is the limited thickness that can be achieved in the strained AlGaN/GaN system. The difference in the lattice structures of these types of materials produces a strain that can result in dislocation of films grown to produce the different layers. This results in high levels of leakage through a barrier layer, for example. Some previous designs have focused on reducing the in-plane lattice constant of the AlGaN layer to near where the point of relaxation occurs to reduce the dislocation generation and leakage. However, the problem of limited thickness is not addressed by these designs.

Another solution is to add insulation layers to prevent leakage problems. The addition of an insulator layer can reduce the leakage through the barrier, and typical layers used for this purpose are silicon oxide, silicon nitride, saphire, or other insulators, disposed between the AlGaN and metal gate layers. This type of device is often referred to as a MISHFET and has some advantages over the traditional devices that do not have an insulator layer.

While additional insulator layers can permit thicker strained AlGaN/GaN systems to be constructed, the confinement layer produced by the additional insulator results in lower current carrying capacity due to the scattering effect produced on electrons at the GaN/insulator interface. Also, the additional interface between the AlGaN layer and the insulator results in the production of interface trap states that slow the response of the device. The additional thickness of the oxide, plus the additional interfaces between the two layers, also results in the use of larger gate drive voltages to switch the device.

Conventional device designs using nitride material to obtain nominally off devices rely on this additional insulator to act as a confinement layer, and may reduce or eliminate the top AlGaN layer. These devices, however, typically have lower current carrying capacity due to scattering at the GaN/insulator interface.

Accordingly, it would be desirable to produce a heterojunction device or FET that has a low leakage characteristic with fewer interfaces and layers that can still withstand high voltage and produce high current densities with low resistive losses. Presently, planar devices have been fabricated with GaN and AlGaN alloys through a number of techniques, including MOCVD (metal organic chemical vapor deposition) as well as molecular beam epitaxy (MBE) and hydride vapor phase epitaxy (HVPE).

Materials in the gallium nitride material system may include gallium nitride (GaN) and its alloys such as aluminum gallium nitride (AlGaN), indium gallium nitride (InGaN) and indium aluminum gallium nitride (InAlGaN). These materials are semiconductor compounds that have a relatively wide direct bandgap that permits highly energetic electronic transitions to occur. Gallium nitride materials have been formed on a number of different substrates including silicon carbide (SiC), saphire and silicon. Silicon substrates are readily available and relatively inexpensive, and silicon processing technology has been well developed.

However, forming gallium nitride materials on silicon substrates to produce semiconductor devices presents challenges that arise from differences in the lattice constant, thermal expansion and bandgap between silicon and gallium nitride. The problems attendant with the lattice mismatch between GaN and traditional substrate materials are also prevalent in material layer structures involving GaN and GaN alloys. For example, GaN and AlGaN materials have lattice structures that differ significantly enough to produce interface strain between the layers, contributing to piezoelectric polarization. In many previous devices, the fields generated by the piezoelectric polarization are controlled to improve the characteristics of the devices. Variations in the content of aluminum in the AlGaN/GaN layer structures tends to vary the lattice mismatch between the materials to achieve different device characteristics, such as improved conductivity or isolation barriers.

A particular application that would benefit from a semiconductor structure with a low forward resistance or voltage drop is a rectifier. Conventionally, rectifiers in power applications are often controlled as synchronous rectifiers, where a diode performs the voltage blocking function of the rectifier, and a synchronous switch across the diode performs current conduction when the diode is forward biased to avoid the ON resistance and forward voltage drop of the diode. This type of configuration requires a switching control for the switch so that it is turned on when the diode is to be operated in forward conduction mode. This type of conventional synchronous rectifier is often used in power applications to avoid the drawbacks of diodes used as rectifiers, such as a forward voltage drop that reduces power efficiency and may also contribute to thermal operating issues. However, because the synchronous switch used with the diode to construct a synchronous rectifier is typically a power switch, a gate driver is used to operate the switch in high power applications. It would therefore be desirable to obtain a rectifier device that does not require additional control operations, but also maintains a low forward voltage drop.

Another type of device that can limit the amount of current flowing through it is a pinch resistor. A pinch resistor is typically fabricated in a semiconductor material with two different types of conductivity material. For example, a P-type conductivity material is disposed in an N-type region, and an $N^+$-type region is formed partially over the P-type material. The resistance of the pinch resistor is determined by the sheet resistance of the P-type material under the overlapping $N^+$-type region and the dimensions of the overlapped P-type material. The current in the device is conducted in a channel that is "pinched" by the opposite semiconductor material. Through these types of designs, very high resistances can be formed in a very small area to effectively limit current in a given power range. However, these types of devices are often imprecise due to processing techniques used during their manufacturing. According to some designs, the current through the device is effectively limited by the voltage generator across the device, which can serve to control the channel to limit the current. In conventional devices, the current values that can be carried in pinch resistors is relatively low, so that power applications tend to be somewhat complicated.

It would be desirable to provide a high current rectifier device such as a diode or pinch resistor that can block significant voltages while obtaining a low forward voltage drop.

SUMMARY OF THE INVENTION

In accordance with the present invention, there is provided a current control device such as a rectifier, realized in a III-nitride material system that is capable of high current conduction and high voltage blocking with a reduced ON resistance. The device operates to manipulate the 2DEG between two III-nitride materials, using ohmic contacts and schottky or insulated contacts.

In accordance with one embodiment of the present invention, a rectifier is provided with a reduced turn on voltage for forward conduction. The rectifier is formed with two III-nitride material layers in which one of the III-nitride material layers has a larger in-plane lattice constant than the other, resulting in the formation of a 2DEG at the interface. The high carrier mobility in the 2DEG permits a low forward conduction voltage to turn on the rectifier. Current through devices shunted through the 2DEG channel and out of the ohmic contact to avoid the schottky barrier. Under reverse voltage conditions, the schottky contact interrupts the 2DEG and opens the channel to prevent current flow in the reverse bias condition.

According to a feature of the present invention, the schottky contact is formed in a recess of a III-nitride layer, such that the device is non-conducting until a forward voltage is applied. Advantageously, recess has sloped walls to permit easy controllability of device parameters.

In accordance with another embodiment of the present invention, there is provided a pinch resistor in the III-nitride material system, which is a bi-directional device formed with multiple ohmic contacts and multiple schottky or insulated contacts. The schottky or insulated contacts are placed between the ohmic contacts and connected to respective ohmic contacts to regulate the formulation of the 2DEG so that current in the channel formed by the 2DEG is controlled according to the voltage applied to the contacts. The device is bi-directional to permit current limiting in either direction.

In accordance with another feature of the present invention, the pinch resistor device can be tuned to obtain unbalanced current limiting features, similar to a rectifier, as well as varying ON resistance. The device can also be tailored to have a high current carrying capacity in both directions.

According to another embodiment of the present invention, there is provided a schottky type rectifier in a III-nitride material system, where the device conducts current through a channel that includes a 2DEG formed by the interface of two different layers of III-nitride materials. The device includes a schottky contact and an ohmic contact for conduction in one direction toward the ohmic contact, and a blocking voltage in the other direction toward the schottky contact. The voltage applied to the schottky contact permits current to flow through the channel formed by the 2DEG and out of the ohmic contact, while a voltage applied in an opposite direction depletes the 2DEG under the schottky contact to block voltage during reverse bias. The highly resistive nature of a GaN layer prevents leakage currents through the device, when GaN is used as one of the III-nitride layers. The device may be constructed with little or no doping of the III-nitride layers to obtain a low field during reverse bias that permits high standoff voltages. This attractive feature is obtained without sacrificing an increase in forward bias resistance.

According to another feature of the present invention, a method for forming the above described devices is provided where a III-nitride layer is provided on an insulative or highly resistive substrate. Optionally, a buffer layer may be provided between the substrate and III-nitride layer, which is preferably composed of GaN. An AlGaN layer is deposited over the resistive GaN layer, followed by the deposition of a protective insulating layer to limit the decomposition of AlGaN at the surface during annealing. A window is opened in the protective insulating layer to access the underlying AlGaN layer. An ohmic metal contact is provided in the window to obtain an ohmic contact for the device. After annealing the ohmic contact, another window is opened in the protective insulating layer, through which a schottky metal is deposited to complete the device.

Advantageously, cladding and contact layers may be grown above or below the active region. Other known processes for constructing electrodes, insulation layers and so forth may also be applied to the present invention.

According to a feature of the present invention, a good GaN insulator interface is provided to improve current carrying capacity, rather than additional insulator layers or structures at the active layer. Without added insulation layers, the epitaxial nature of the hetero-interface described here leads to an order of magnitude higher mobility for the electrons in the 2DEG when accumulated.

According to another embodiment of the present invention, a nominally off current control device realized in a III-nitride material system provides an AlGaN/GaN interface to provide a location for the formation of a 2DEG. The region surrounding a schottky contact in the AlGaN layer is etched back to eliminate the 2DEG locally to obtain an enhancement mode device. According to a feature of the present invention, the current control device includes two schottky contacts positioned adjacent corresponding ohmic contacts, where the schottky contacts are equidistant from each of the ohmic contacts forming the current carrying device.

According to a feature of the present invention, the AlGaN layer is etched back in a region around the schottky contact to form an enhancement mode device, where the 2DEG is locally eliminated between the AlGaN/GaN layers.

The large dielectric breakdown field in the III-nitride semiconductor material system permits the construction of nominally off power devices with reduced size standoff regions. The material system also permits the production of devices with reduced specific on resistance in comparison with known devices of similar voltage ratings. In the case of the GaN/AlGaN devices discussed herein, a planar device has approximately a one hundred fold improvement in specific on resistance at a voltage rating of approximately 300 volts when compared to a vertical geometry counterpart.

III-nitride current control heterojunction devices can take advantage of symmetrical properties to permit the fabrication of a nominally off device that can block voltage in both directions without sacrificing wafer area. Because of this advantage over traditional devices that block voltage in a single direction, one bi-directional device can replace a number of single directional devices.

The device is also characterized by low leakage in the contacts and a high breakdown field from the barrier layer. As a result, the device provides a larger dielectric constant compared to conventional insulators such as $SiO_2$ and SiN. The high critical fields of the GaN material allow thin layers to withstand large voltages without dielectric breakdown. The dielectric constant of GaN materials is approximately 10, which is a factor of 2.5 times better than $SiO_2$.

Other features and advantages of the present invention will become apparent from the following description of the invention which refers to the accompanying drawings.

DETAILED DESCRIPTION OF THE PREFERRED EMBODIMENTS

Figure 1A:
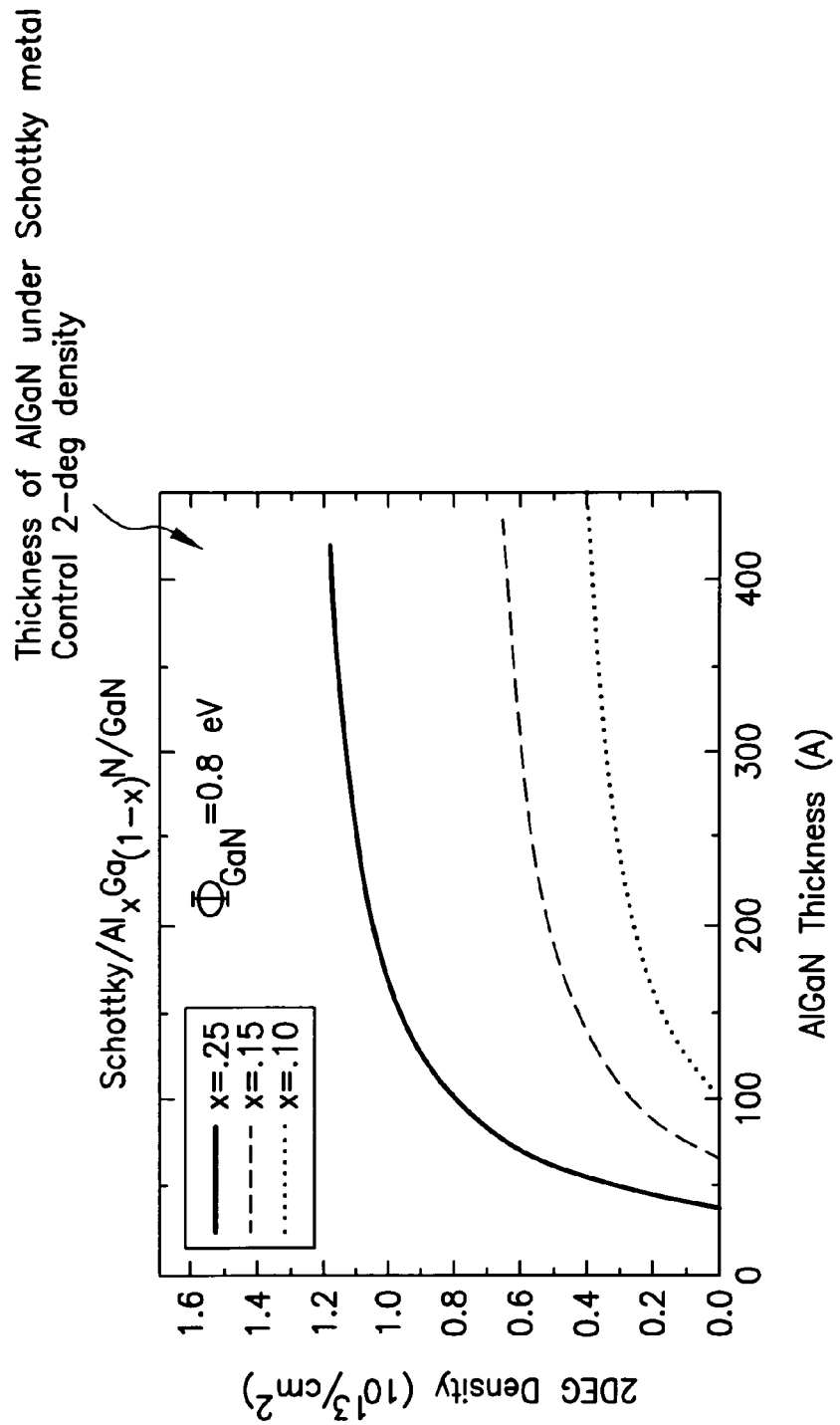
FIG. 1A graphically shows the relationship between the thickness of AlGaN and the density of 2DEG in an AlGaN/GaN heterojunction device.

In the construction of GaN material devices, a number of factors come into play to impact the functionality and capability of the devices. A large lattice mismatch in III-nitride materials and the strong piezoelectric and polarization effects in these materials significantly impact the electrical properties of III-nitride heterojunction devices. A significant number of reported GaN-based devices to date use strained GaN—AlGaN junctions with alloy compositions that are designed to maximize the strain but avoid surpassing the relaxation limit that would lead to dislocations or long term instabilities in the devices. The devices generally are grown to maximize the strain within the limit of relaxation. As the thickness of AlGaN increases, or the Al content in AlGaN increases, the strain also increases which leads to the increase of the 2DEG density, as well as the carrier mobility. However, if the AlGaN layer is increased in thickness too much, or the Al content is too great, the whole layer relaxes and loses all the above desirable properties. Various devices and systems for building heterojunction devices have been proposed to control the lattice mismatch and the strain of the GaN—AlGaN junctions. These devices are particularly designed to take advantage of piezoelectric and spontaneous polarization effects and to minimize long term instabilities.

GaN/AlGaN devices typically have one or more terminals for controlling electrical power flow in a given device. An electrical potential applied to a terminal controls the flow of current in an electrically conductive channel to which the terminal is coupled. The electrically conductive channel is defined by at least one heterointerface between two different semiconductor materials.

When AlGaN/GaN materials compose the semiconductor materials of a heterojunction device, and AlGaN is used as a barrier layer, polarization charges resulting from the spontaneous polarization properties of AlGaN as well as strain induced characteristics known as piezoelectric polarization fields are present. The control of the formation of these fields in the construction of a III-nitride device leads to different characteristics that make GaN-based devices suitable for a wide variety of applications depending upon how the device is characterized.

Heterojunction devices formed with GaN materials typically include a barrier layer of AlGaN that is disposed on the GaN layer to induce a 2DEG (two dimensional electron gas) that produces a high concentration of electrons in the channel to thereby enhance the electrically conductive properties of the channel. Due to the presence of the 2DEG formed at the interface of the AlGaN/GaN layers, fundamentally formed III-nitride devices are nominally on because the presence of the channel permits conduction of current between electrodes, for example.

Current in 2DEG can be pinched if 2DEG is depleted of charge. According to the present invention, the charge in a selected region of the channel is reduced, in order to reduce the maximum amount of current that can pass therethrough. As a result, the current can be "pinched" at a certain maximum level. Preferably, the selected region is small so that the overall resistance of the device can remain low until the pinch condition is reached.

Figure 1B:
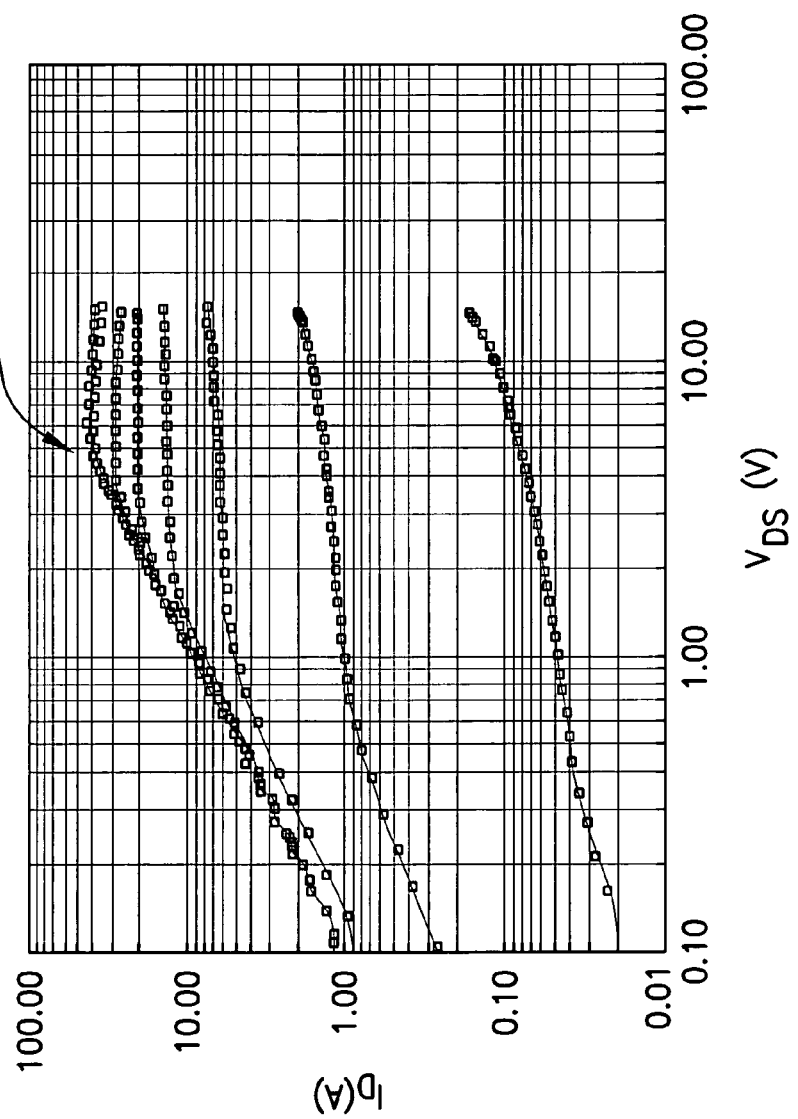
FIG. 1B graphically illustrates the current pinching effect in the device according to the present invention.
Figure 2A:
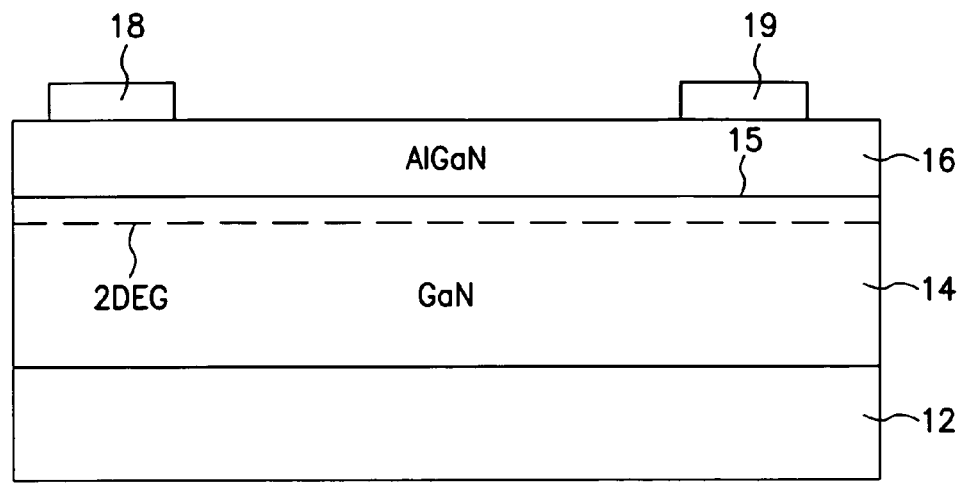
FIG. 2A is a cross-sectional view of a partially formed III-nitride current control device in accordance with the present invention.

As shown in FIG. 1A, calculations have shown that 2DEG density can depend on the thickness of the AlGaN layer (16, FIG. 2A). According to one aspect of the present invention, the AlGaN layer in a small region of the device is thinned in order to reduce the density of the 2DEG locally, thus allowing for the pinching effect as will be shown later. As AlGaN is thinned down, the pinch current is reduced as seen in FIG. 1B. If AlGaN is thinned until the 2DEG is eliminated under the gate, the pinch current of the device is reduced to 0, or near 0. Under such condition, the device is effectively a rectifier, since pinching will only occur in one direction.

Referring now to FIG. 2A, a heterojunction device according to the present invention in the early stages of formation is illustrated as device 10. Device 10 includes a substrate 12, an insulating GaN layer 14 and an active AlGaN layer 16. Ohmic contacts 18 and 19 are formed on AlGaN layer 16 to serve as connections or terminals in the resulting device. GaN/AlGaN interface 15 forms a conductive channel with a 2DEG that permits current flow between Ohmic contacts 18 and 19.

GaN layer 14 of device 10 has a larger in-plane lattice constant than AlGaN layers 16. It should be apparent that other III-nitride materials may be used to form device 10, as long as an interface permits a channel to be formed for current conduction. Substrate 12 is an insulating substrate, but can be highly resistive, or doped n or p type, and is typically formed from well-known materials, such as silicon carbide, silicon, saphire and other well-known substrate materials.

Figure 2B:
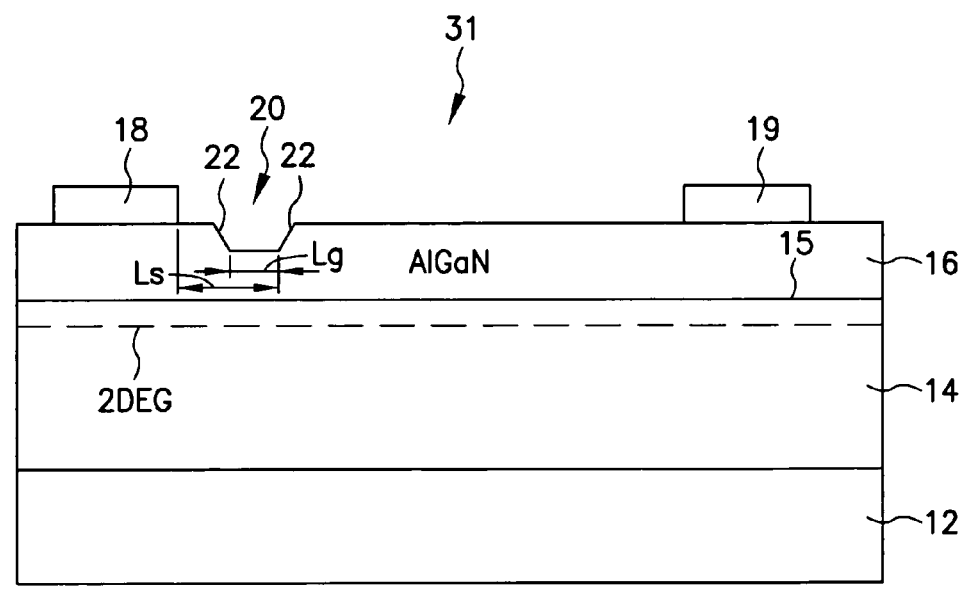
FIG. 2B illustrates an etched contact region in the device of FIG. 2A.

Referring now to FIG. 2, a recess 20 is shown etched into AlGaN layer 16 near contact 18. Recess 20 includes slanted side walls 22, but need not be constructed according to any specific geometry. Having slanted side walls 22 is preferred for minimizing the resistivity of the device. Furthermore, separation distance $L_s$ and gate length $L_g$ can also be used to control the level of pinch current. Recess 20 permits a contact to be deposited with closer proximity to the interface between AlGaN layer 16 and GaN layer 14. It should be noted, however, that even without an etched recess, the device will pinch the current at a maximum level. Such a device would also be considered a pinch resistor, as will be seen later.

Figure 2C:
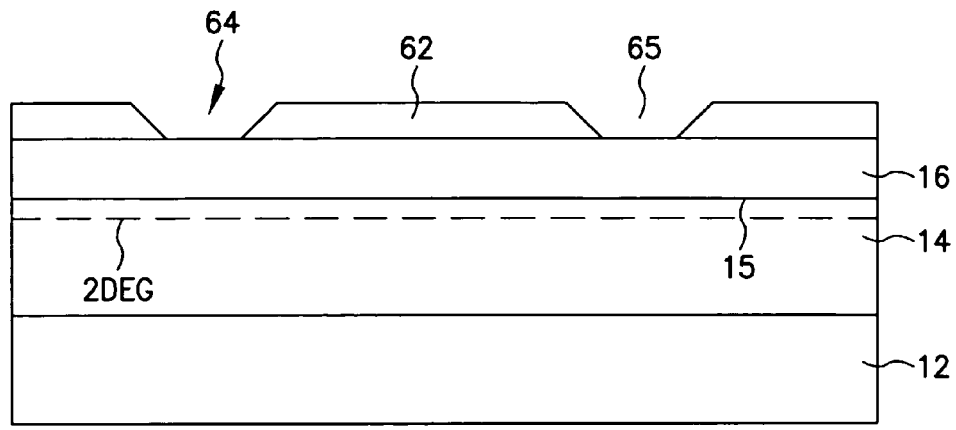
FIG. 2C illustrates a method for forming the recesses shown in FIG. 2B.

Referring now to FIG. 2C, a technique for fabricating a device 60, which can be processed to form device 56, is illustrated. A photoresist layer 62 is applied over III-nitride barrier layer 16, and openings 64, 65 are formed in photoresist layer 62. Openings 64, 65 have sloped side walls to permit an etching step to transfer the sloped geometry to III-nitride barrier layer 16. Sloped side walls 22 illustrated in FIG. 2B can be formed according to this technique. Typically, III-nitride barrier layer 16 is composed of AlGaN, and a suitable etch process is used with photoresist layer 62 and openings 64, 65 to define recesses in layer 16 with sloped side walls.

Figure 3A:
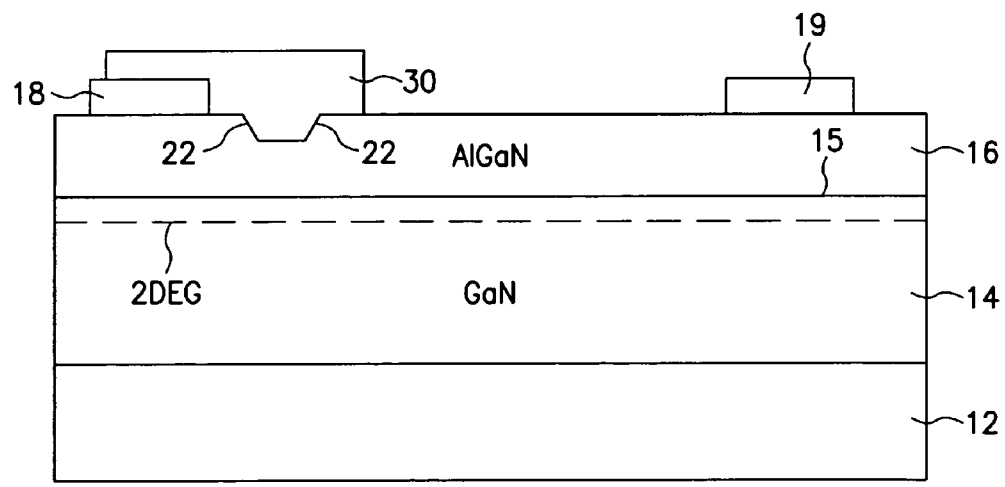
FIG. 3A illustrates a device according to the first embodiment.

Referring to FIG. 3A, a device 31 has a contact 30 that is composed of a schottky metal. In a reverse bias, or off state, device 31 does not conduct current between ohmic contacts 18 and 19, because the current carrying channel established by the 2DEG is interrupted underneath contact 30. When forward biased (when contact 18 and 30 are more positive then contact 19), device 31 is operable to carry current between ohmic contacts 18 and 19. This is due to the filling of channel under contact 30.

Contact 30 can be composed of a schottky metal atop AlGaN layer 16 deposited in recess 20 and overlaying contact 18. As noted above, AlGaN layer 16 may be replaced by any III-nitride material layer, as long as the in-plane lattice constant of layer 16 is less than the in-plane lattice constant of layer 14, or the band gap of layer 16 is larger than the band gap of layer 14.

Device 31 may be constructed with a number of different geometries for ohmic contacts 18 and 19 and contact 30. For example, contact 30 can be a schottky contact encircling ohmic contact 18. Contact 30 may also be formed around a portion of ohmic contact 18, with gaps or etched regions formed to limit current flow in specific directions or to specified regions on device 31. Ohmic contact 18 and contact 30 formed as a schottky contact can also be spaced various distances from each other to increase or decrease breakdown voltage, pinch current, and on-resistance parameters.

The combination of the schottky diode and pinch current results in a very unique device. In effect, the etch has changed the pinch voltage for the device. After pinchoff occurs, further voltage at the second contact is dropped by the etched region of the device. As a result of the reduced pinch voltage achieved by the recess etching, the schottky contact must block only the pinch voltage. This pinch voltage can be reduced to 1-2V range with etching which allows for a very low leakage device even when the schottky diode is poor in quality, or has a low schottky barrier height.

According to the present invention, a recess 20 causes a local change in the 2DEG density. A recess, although preferred, is not the only way in which the local density of 2DEG can be reduced. The change in the density of 2DEG can be accomplished for localized oxidation of the AlGaN to form AlGaO or AlGaON, by implantation or diffusion of P-type dopant under the pinching contact, or by varying the orientation of the interface locally.

Figure 3B:
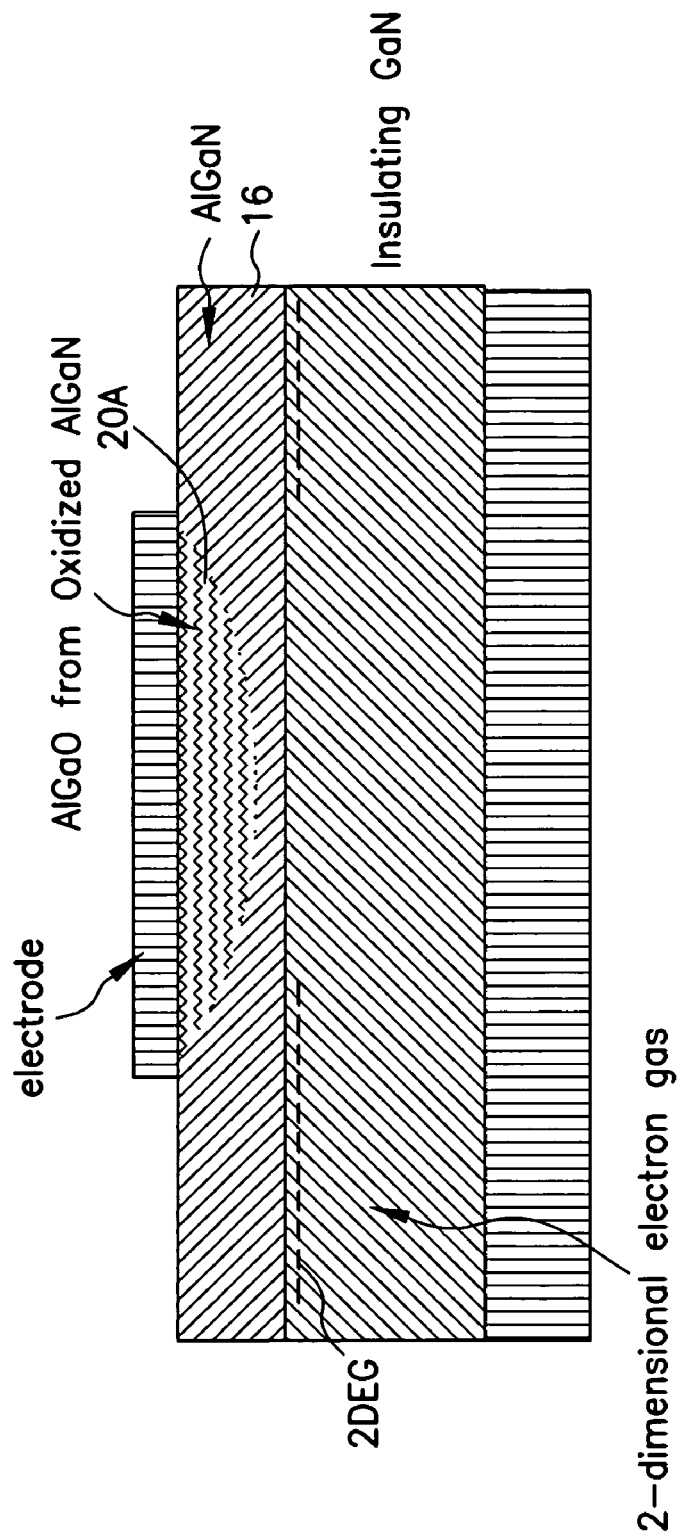
FIG. 3B shows a portion of another variation of a device according to the present invention as shown, for example, in FIG. 3A.

Referring, for example, to FIG. 3B, a region 20A can be oxidized instead of a recess 20 in order to locally reduce the density of 2DEG. Region 20A can be formed by first covering the AlGaN with SiN or another oxidation protective coating, then opening a window in the SiN over the region to be oxidized, and then carrying out the oxidation step. The oxidation can be achieved through high temperature exposure to $H_2O$, $O_2$, Oxygen plasma, or other well known chemistries. $H_2$ containing gases can help catalyze the process if due caution is exercised when working with $H_2$ and oxygen at high temperatures.

Figure 3C:
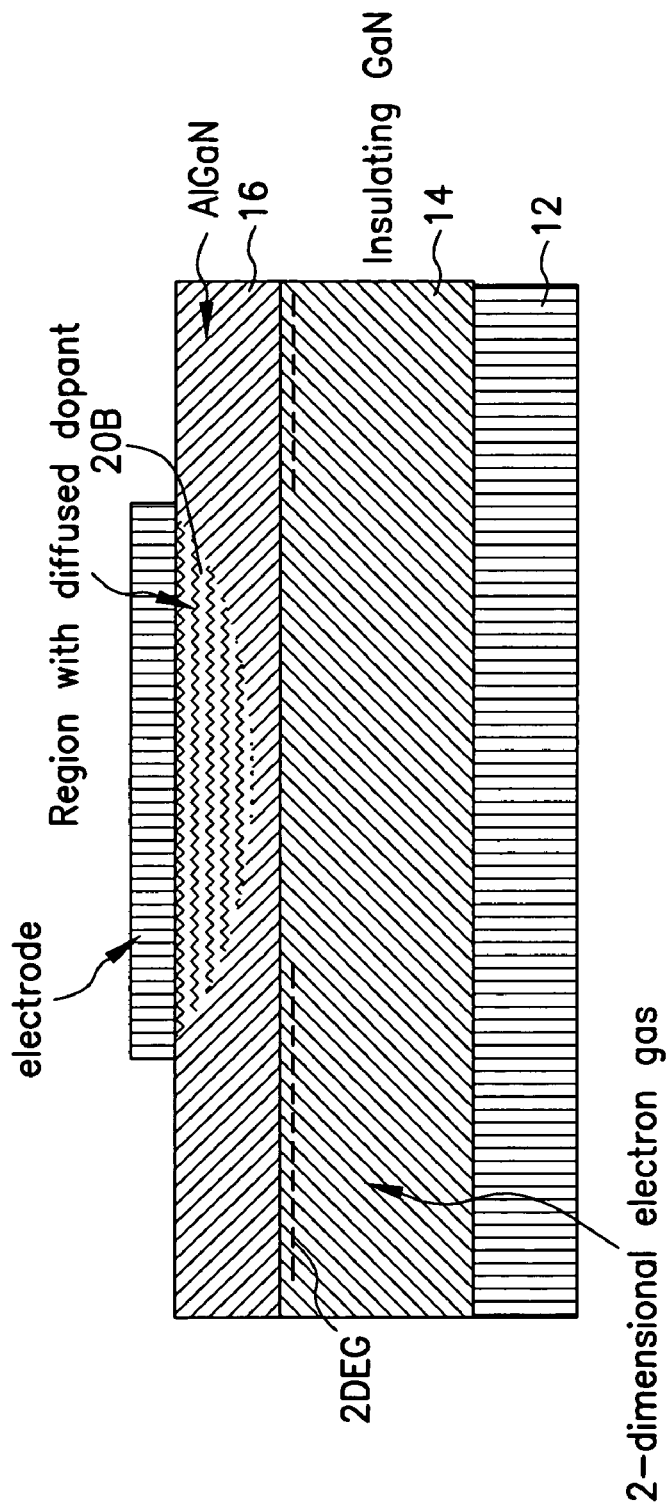
FIG. 3C shows a portion of another variation of a device according to the present invention as shown, for example, in FIG. 3A.

Referring next to FIG. 3C, instead of recess 20, a region 20B in the AlGaN can be doped. Thus, for example, the AlGaN can be covered with SiN or any other suitable protective coating, and then a window can be opened in the SiN over the desired location to region 20. Thereafter, in an environment of high temperature, the AlGaN is exposed to a Mg, Fe, or Cr containing gas. Alternatively, one of the dopants can be deposited or implanted at the bottom of the window in the SiN layer over the AlGaN, and diffused therein in an annealing step. The exact time and temperature will depend on the desired doping level and the diffusivity of the dopant into the AlGaN.

Figure 3D:
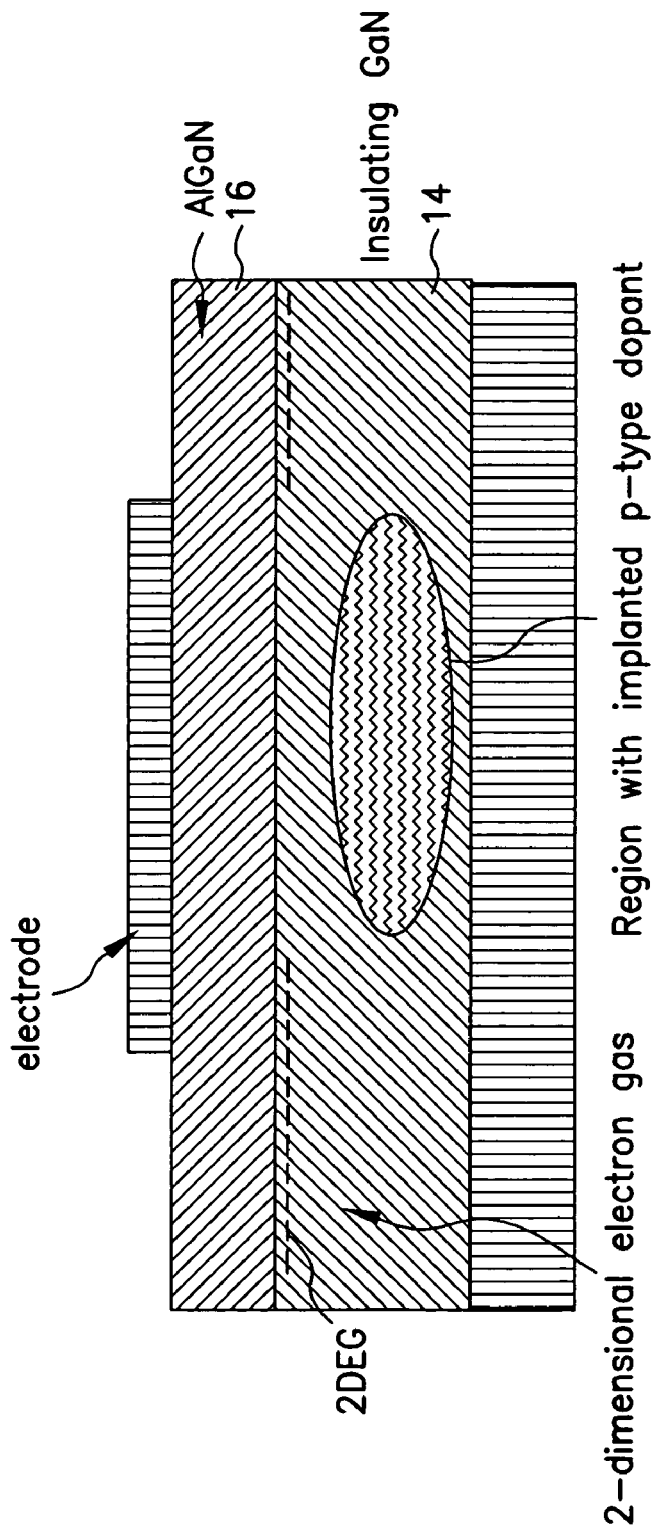
FIG. 3D shows a portion of another variation of a device according to the present invention as shown, for example, in FIG. 3A.

Referring now to FIG. 3D, according to another variation, a doped region 20C can be formed in GaN layer 14, instead of AlGaN layer 16. A standard implantation and annealing step can be used to form region 20C either through the AlGaN 16, or region 20C can be formed in the GaN layer 14, and covered by another layer of GaN, and then an AlGaN layer 16. The P-type dopants may be either Mg, Fe, Cr, Zn. Mg or Zn would be the preferred dopants.

Figure 4:
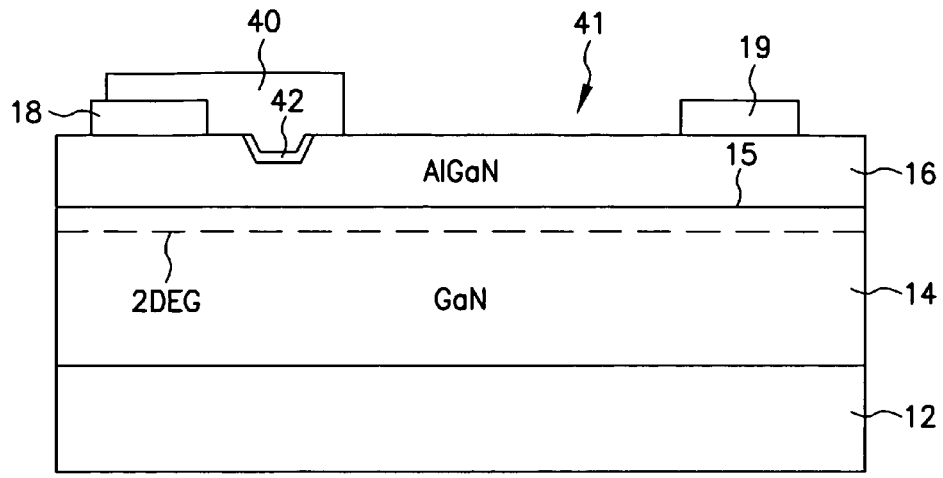
FIG. 4 shows a device according to another embodiment of the present invention.

Referring now to FIG. 4, an alternate embodiment of the present invention is illustrated as device 41. Device 41 is substantially similar to device 31, with the exception that contact 40 is formed of a conductive material on an insulator layer 42. Accordingly, contact 40 is an insulated contact rather than a schottky contact, and can include a metal conductor of any type to operate device 41. In addition to metal conductors, other conductive materials such as Si, GaN, or Ge can also be used. Operation of device 41 is substantially the same as that of device 31, where the 2DEG is interrupted or reduced in density under contact 40. Application of an electric potential to contact 18 (and thus contact 40) that is greater than the electrical potential applied to ohmic contact 19 causes the formation of a 2DEG under contact 40, and device 41 can conduct current between ohmic contacts 18 and 19.

Figure 5:
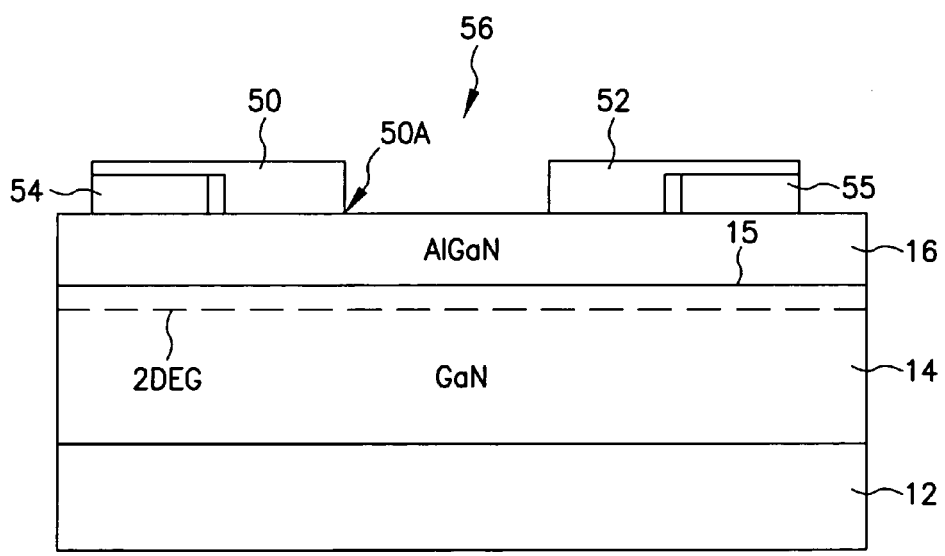
FIG. 5 is a cross-sectional view of a pinch resistor with schottky contact formed in accordance with an embodiment of the present invention.

Referring now to FIG. 5, another embodiment according to the present invention is illustrated as device 56. Device 56 is a pinch resistor with two electrodes, 50, 52. As with devices 31 and 41, electrodes 50 and 52 may be formed in a recess in AlGaN layer 16 in order to reduce the density of 2DEG under the recess to change the pinch current without turning the device off, whereby device 56 can become a pinch resistor and used to control the current level. Device 56, however, illustrates another configuration that operates well for the pinch resistor device as a current controller.

The device shown by FIG. 5 works as follows. When a voltage is applied between ohmic contacts 54, 55, electrons are injected from ohmic contact 54 in the channel that is formed by AlGaN 16 and GaN 14. The charge flows laterally in the channel, under the schottky contact 50, across the drift region, under schottky contact 52 and out ohmic contact 55. Due to the resistance in each of these regions, voltage drops as the current flows. As a result, the voltage of the channel varies laterally from one end of the device to the other. The more current that flows, the higher the voltage drop across the device. In particular, the voltage in the channel directly under the schottky contact will vary with the amount of current. When the voltage difference between this point in the channel, and the schottky contact reaches a particular value called V pinch, or V threshold, the density of the electrons in the channel is depleted, and no further increase in the current will occur with added voltage applied to ohmic contact 55.

A device according to FIG. 5 is symmetric so that it is bi-directional, but a unidirectional device could be made if second schottky contact 52 is removed. In this case the pinching action would only occur in one direction. In the above description, it was assumed that ohmic contact 54 is at 0 bias, and ohmic contact 55 is positively biased relative to contact 54. To form schottky contacts 50, 52 any number of materials can be used including Au, Ni, or Pt. It should be noted that the pinch current can be tuned by varying the work function of the metal chosen for forming schottky contacts 50, 52. Another variation is to use P-type GaN in place of a schottky metal. Placement of a schottky contact 50, 52 is important for determining the current at which the device pinches off. Since the voltage in the channel varies across the device, the farther from the ohmic the edge of the schottky is placed, the lower the pinch current. Field plates can also be included in the design for increased breakdown voltage. Thus, in a device according to FIG. 5, it is the edge 50A of such schottky contacts 50, 52 that determines the pinch current.

When one contact 54, 55 is forward biased with respect to the other (e.g. contact 54 is at a higher potential then contact 55 and vice versa) current travels between the two contacts. Thus, the device shown in FIG. 5 is a bidirectional device. According to the principles of the operation of the previous devices described herein the current is pinched regardless of which direction the current is travelling. Thus, device 60 is a bidirectional pinch resistor.

The pinching occurs because the potential under contacts 50, 52 is different due to the current conduction. Thus, the current itself establishes the differences in potential and self limits the level of conduction.

Device 56 is a nominally bi-directional device and provides balanced current conduction between electrodes 54, 55 when the spacing to respective schottky contacts 50, 52 is maintained to be equivalent. That is, by forming the spacing between electrode 54 and schottky contact 50 to be the same as that between electrode 55 and schottky contact 52, breakdown voltage, on-resistance and other switch characteristics can be balanced so that device 56 operates substantially the same whether current is flowing from electrode 54 to electrode 55, or vice-versa. It should be apparent that a number of parameters may be modified to alter the device characteristics, such as ON resistance, pinch off current, breakdown voltage, and so forth.

As current flows in the channel of device 56, a voltage potential builds with respect to the schottky contacts 50, 52 and AlGaN layer 16. As the voltage builds with increased current, a point is reached where the voltage potential causes the interface region 15 to deplete, pinching off the 2DEG conduction channel. As the current in the channel from one ohmic contact to the other increases, the voltage at the 2DEG under the schottky contacts will change in reference to the voltage on the schottky contacts. Eventually, the voltage difference between the schottky contact and the 2DEG will cause depletion of the 2DEG and pinch the current to a saturated value. Because device 56 is a bi-directional device, the pinch off feature operates in either direction, and can be tailored to particular applications through the structure and content of the layers and contacts. For example, it may be desirable to produce a device that has a higher pinch off current in one direction than in the other, which can be achieved by manipulation of the relationship between the schottky and ohmic contacts. The current limiting feature of device 56 makes it a useful element in power applications, where overcurrent conditions can cause damage to power system components.

The operational design goals of device 56 may be achieved by the placement of a contact between the two ohmic contacts 54, 55 to result in a current limiting action. Accordingly, both schottky contacts 50, 52 are not required to operate device 56 in keeping with the present invention. For example, referring to FIG. 3A, a current control device 31 illustrates the concept of the invention described in FIG. 5 in a nominally off device with a single contact between two ohmic contacts 18, 19. It should be apparent that a device similar to that illustrated in FIG. 3A may be constructed in accordance with device 56 to provide a nominally on device that acts as a pinch resistor with a single schottky contact.

Thus, a pinch resistor according to another variation of the present invention may include two ohmic contacts 54, 55, two current limiting contacts 50, 52, and an etched recess under each current limiting contact 50, 52 as seen for example under contact 40 in FIG. 4 and under contact 30 in FIG. 3A. In a device according to the present invention, current flows between ohmic contacts 54, 55, while current limiting contacts 50, 52 act to set the surface potential to a constant value that is equal to the potential of the ohmic contact to which it is connected. The function of the etched recesses in a pinch resistor according to the present invention can be to reduce the density of 2DEG, but not eliminate it. By changing the depth, the width of the etched recesses, and the shape of the maximum allowable current through the device can be controlled. Thus, the recesses provided in a pinch resistor according to the present invention can change the current value at which the device pinches off.

Figure 6:
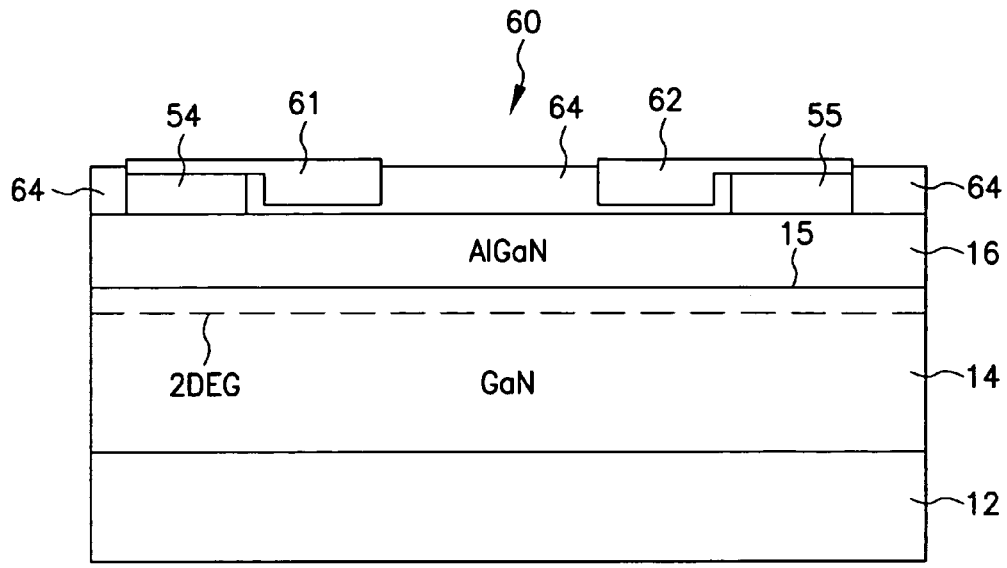
FIG. 6 is a pinch resistor with insulated contacts formed in accordance with an embodiment of the present invention.

Referring now to FIG. 6, another embodiment of a pinch resistor according to the present invention is illustrated as device 60. Device 60 includes insulated contacts 61, 62 instead of schottky contacts 50, 52 illustrated in FIG. 5. The insulated contacts have the added advantage of allowing higher levels of voltage blocking without device failure. Device 60 operates in the same way as device 56, that is, as a pinch resistor that pinches off the channel formed by the 2DEG at interface 15 when a sufficient amount of current is carried through the conduction channel. However, insulated contacts 61, 62 can be formed of any conductive material. Insulated contacts 61, 62 are in electrical contact with ohmic contacts 54, 55 in device 60, so that pinch off control is affected by current carried through ohmic contacts 54, 55, inducing a voltage difference between insulated contacts 61, 62 and the 2DEG at interface 15. Device 60 is substantially the same in all other respects as device 56, in that a single insulated contact would suffice to permit device 60 to operate as a pinch resistor, modifications in the layer material contents and configuration of the various contacts permits particular parameter characteristics for the device, and device 60 can act as a current sensing device. Device 60, however, also includes an insulator layer 64 that is formed prior to the formation of insulated contacts 61, 62, to permit insulated contacts 61, 62 to be insulated from AlGaN layer 16.

Ohmic contacts 54, 55 may be fabricated in a number of ways, such as implantation of dopants such as Si or Ge, prior to deposition, deposition of highly doped III-nitride material on top of AlGaN layer 16 prior to ohmic deposition, III-nitride super lattice structure formation under the ohmic contacts 54, 55, etching of AlGaN layer 16 in combination with the above depositions, and so forth.

Both devices 60 and 56 are bi-directional, which improves their flexibility and the number of applications. Devices 56 and 60 can also be formed with HFETs where the gate electrode is shorted to the source electrode. The separations between the ohmic and schottky contacts can be varied to increase or decrease pinched current. The geometry of the schottky contacts can be realized in a variety of configurations, such as schottky material encircling an ohmic contact, two schottky contacts encircling each ohmic contact, a non-encircling schottky with etched regions to limit current flow to specified regions on the device, and so forth.

Figure 7:
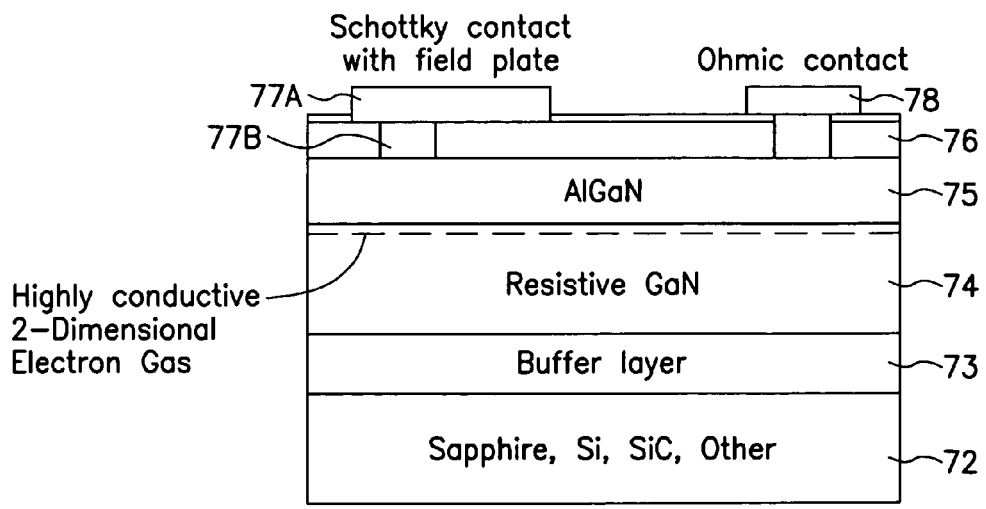
FIG. 7 is a cross-sectional view of a rectifier formed in accordance with another embodiment of the present invention.

Referring now to FIG. 7, another embodiment of the present invention is illustrated as device 70. Device 70 includes a substrate 72 composed of insulative or highly resistive material, such as sapphire, silicon, silicon carbide or other suitable materials. A resistive III-nitride material layer 74 overlays substrate 72, and optionally includes a buffer layer 73 interposed between layer 74 and layer 72. Buffer layer 73 can be interposed between layers 74 and 72 to reduce or alleviate the strain forces related to the lattice mismatch between layers 72 and 74. Another III-nitride material layer 75 is overlaid on layer 74 such that layer 75 has a smaller in plane lattice constant than layer 74. In accordance with the nature of III-nitride materials, a 2DEG forms between layers 74 and 75 that is capable of carrying high amounts of current.

Figure 11:
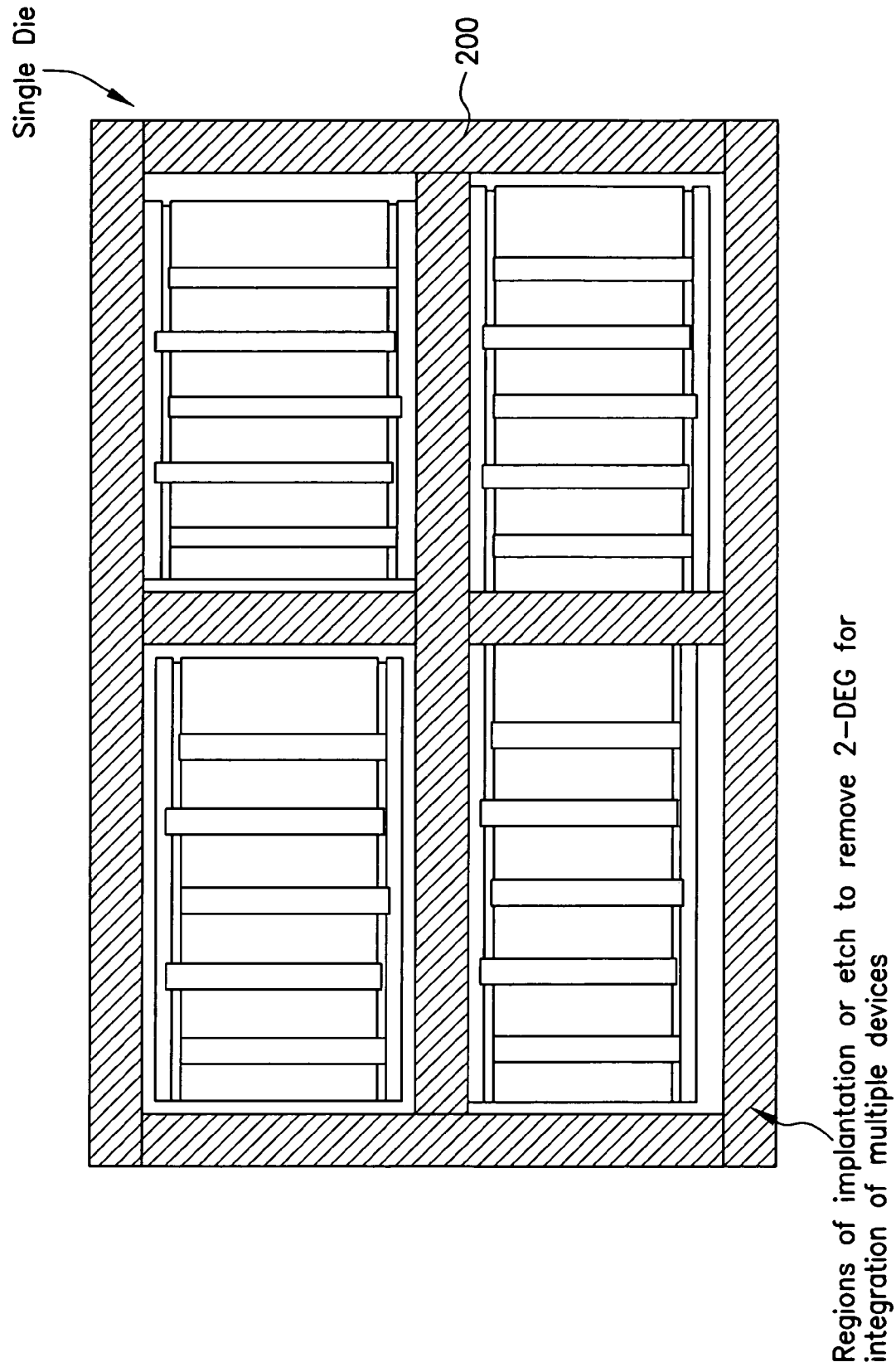
FIG. 11 shows a top plan view of a variation of a device according to the present invention.

Device 70 also includes an insulative layer 76 that protects the underlying layer as well providing a means for patterning the device to form contacts and electrodes. Device 70 also includes contacts 77B and 78, where contact 77B is a schottky contact and contact 78 is an ohmic contact. Contacts 77B, 78 are arranged in a field plate design where the portion of the contacts extending through insulating layer 76 to contact layer 75. That is schottky contact 77B includes a field plate portion 77A. The resulting device is a nominally on rectifier due to the formation of the high density high mobility 2DEG at the interface between layers 74, 75. The 2DEG is formed through a combination of piezoelectric and spontaneous polarization forces, resulting in an extremely thin yet highly conductive layer and a highly resistive layer. A channel formed at the interface between layers 74 and 75 can carry very high current without the use of a thick doped region. Accordingly, in a forward biased direction where the device is conducting, high amounts of current may be carried through the channel. Under reverse bias conditions, the channel is depleted of mobile charge, so that no current flows in the channel, and the highly resistive nature of the underlying layer 74 prevents charge from flowing in that layer as well. Because layers 74 and 75 are undoped, the reverse bias condition of the device produces low electric fields. Because the fields are of a low value, the device is capable of withstanding high voltages, but still produces a low forward bias resistance. The high critical fields as well as interdigitation improve RA product for a given breakdown voltage. Another feature of device 70 is the ability to isolate the device by etching layer 75, due to the resistive qualities of layer 74. That is, by etching through layer 75, the 2DEG can be interrupted. Because the continuity of 2DEG is interrupted, by etching all or a portion of layer 75, multiple devices may be formed on a single substrate, but electrically isolated from one another. FIG. 11 illustrates regions 200 which may be recesses, implanted regions, or any other feature which may interrupt the 2DEG at selected locations to allow for the formation of multiple electrically isolated devices in one die. All these features and advantages permit the integration of a number of devices on a single chip with a small cost in real estate so that high power device exhibiting some amount of complexity can be formed in a smaller space than was conventionally possible.

Figure 8:
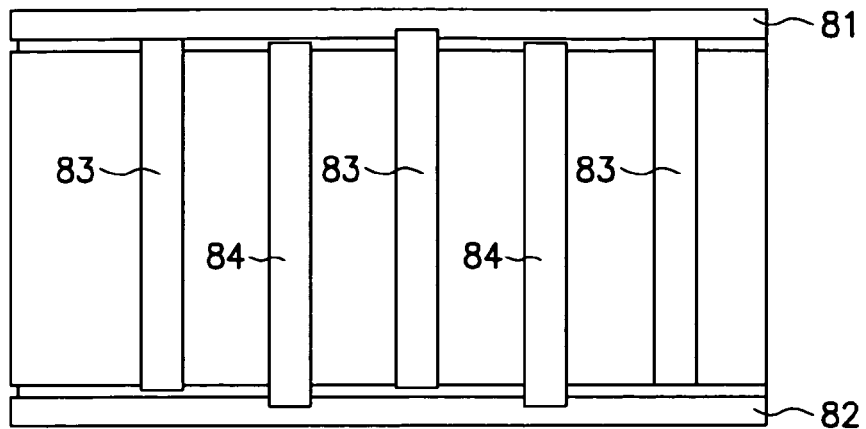
FIG. 8 is a plan view of the rectifier of FIG. 7 illustrating interdigitated electrodes.

Referring now to FIG. 8, a diagram of a construction of the rectifier with interdigitated fingers is illustrated as device 80. By providing device 80 with interdigitated fingers for the different contacts, device 80 realizes an improvement in RA product. Schottky contact runner 81 provides a common connection for the schottky contact fingers 83, while ohmic contact runner 82 provides a common contact for ohmic contact fingers 84. In rectifier device 80, current flows from ohmic contacts 84 to schottky contacts 83 with very low resistance and high current capacity under forward biased conditions. When reverse biased, an electrical potential on schottky contacts 83 depletes the 2DEG region to interrupt the channel formed at the interface between layers 74, 75. Because schottky and ohmic contacts 83, 84 are interdigitated, a number of current paths are provided that improve the RA product.

A device according to FIGS. 7 and 8, conducts and blocks the voltage laterally. In addition, in contrast to the prior art, a device according to FIGS. 7 and 8 is a schottky device which makes use of a high density 2DEG.

It should be noted that the high level of interdigitation improves the efficiency of space usage as well.

In a device according to the preferred embodiment, insulation layer 76 is very thin (10-200 Å), while the width of field plate 77A is very large (1-3 μm), which is comparable to the size of schottky contact 101 (3-10 μm). In a device according to a conventional design, the contact area is much larger than the plate width. The reason for having a larger than usual field plate is that the schottky contact in this type of heterojunction device is very leaky at high fields. Large field plate 77A transfers the field to the edge of the schottky metal that is sitting on an insulator where leakage does not occur. Thus, the schottky contact can be shielded from high fields.

Figure 9A:
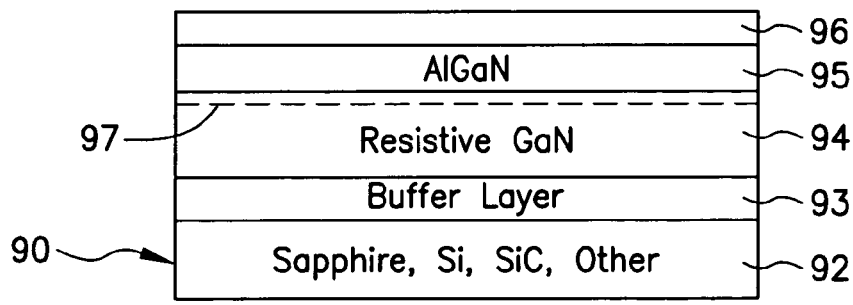
FIGS. 9A-9E illustrate operations in the formation of the device of FIG. 7.

Referring now to FIGS. 9A-9E, a technique for fabricating a device 90 in accordance with the present invention is illustrated. In FIG. 9A, device 90 is shown after the formation of a number of layers over a substrate 92. Substrate 92 may be composed of an insulator or highly resistive material, such as sapphire, silicon, silicon carbide or the like. A resistive III-nitride layer, such as a GaN layer 94 overlays substrate 92, with a buffer layer 93 interposed therebetween. Buffer layer 93 is provided to help alleviate the strain induced by the lattice mismatch between the substrate 92 and layer 94. Layer 94 is overlaid by another III-nitride layer 95, illustrated in device 90 as an AlGaN layer. Layer 94 has a larger in plane lattice constant than layer 95, causing the formation of a 2DEG 97 at the interface of layers 94, 95.

Figure 9B:
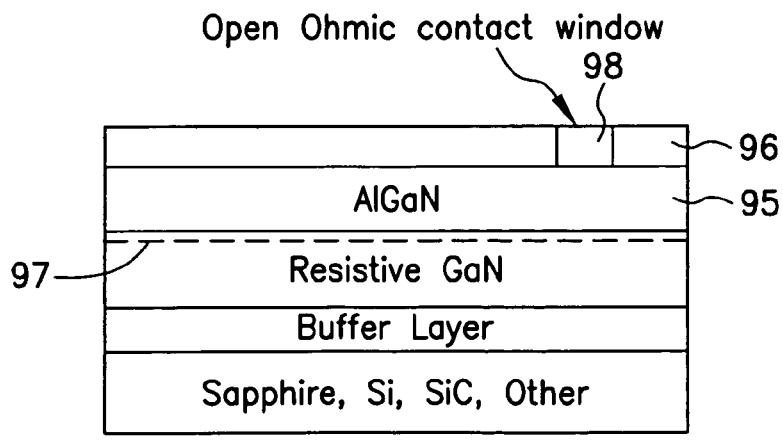
Figure 9C:
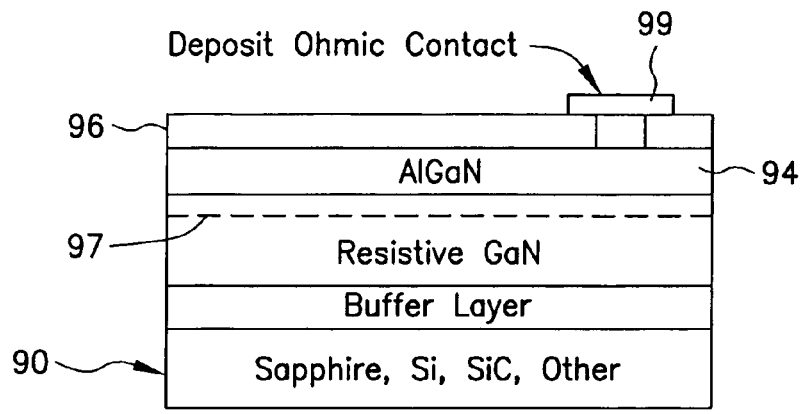

Referring to FIG. 9B, a contact window 98 is opened in insulator layer 96 for the formation of an ohmic contact on layer 95. FIG. 9C illustrates the deposition of the ohmic contact 99 to provide a connection to AlGaN layer 94 to provide a path for current carried in the channel formed by 2DEG 97.

Figure 9D:
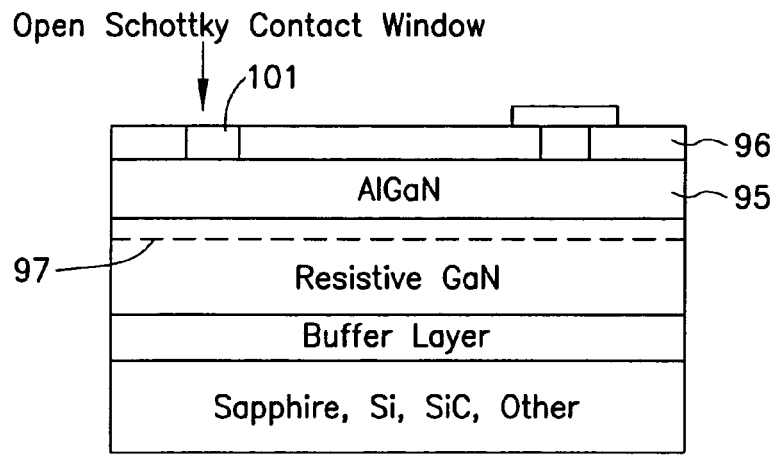
Figure 9E:
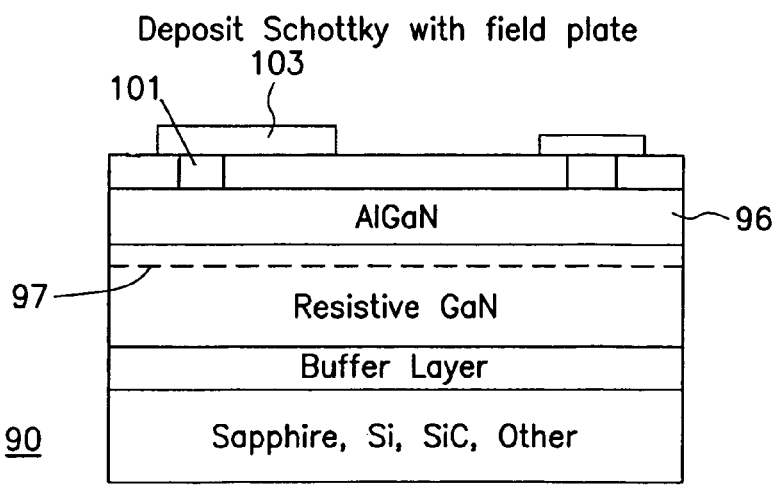

Referring now to FIG. 9D, a schottky contact window 101 is opened in insulator layer 96 to expose AlGaN layer 95. Referring to FIG. 9E, a schottky contact 103 is deposited over and in contact with AlGaN layer 96 through contact window 101. Schottky contact 103 is also capable of carrying current supplied from the channel formed by 2DEG 97.

In forming device 90, which acts as a rectifier as described above, insulator layer 96 is first deposited over layer 95 to limit the decomposition of AlGaN layer 95 during annealing. When ohmic metal contact 99 is deposited through insulating layer 96 in FIG. 9C, an anneal process takes place to complete the formation of ohmic contact 99. During the annealing process, insulator layer 96 prevents substantial decomposition of AlGaN layer 94. Note that none of the layers forming device 90 need the be doped or subjected to typical processes used in the formation of doped semiconductor material. The lack of a doped current carrying layer, and the use of the highly conductive 2DEG 97 greatly improves RA product for a given breakdown voltage. Resistive GaN layer 94 also permits isolation of device 90 by etching AlGaN layer 94. This facility for isolating device 97 permits the integration of numerous devices on a single chip, so that a complete power system can be realized in the fabrication of an integrated circuit.

Note that schottky contact window 101, for example, may be formed with sloped sides in accordance with the devices of several embodiments discussed herein.

The construction of ohmic contacts, schottky contacts, insulator layers and metallized contacts may be performed according to known techniques. In addition, passivation layers and cladding may be applied to the devices described herein, as well as techniques for forming contacts to current carrying electrodes and gates to provide a finished device.

The III-nitride materials used to construct devices 31, 41, 56, 60 and 70 typically exhibit much better blocking characteristics than conventional materials, so that the devices may be constructed in a smaller size than is permitted with conventional materials, while maintaining operational parametric values. Because devices 31, 41, 56, 60 and 70 may be realized in a smaller size than conventional devices to perform comparative functions, a reduced on-resistance can be realized to obtain improved power efficiency.

In addition, the electrodes described herein may be formed with a low resistive ohmic contact process that further improves the operational characteristics of the described devices.

Figure 10:
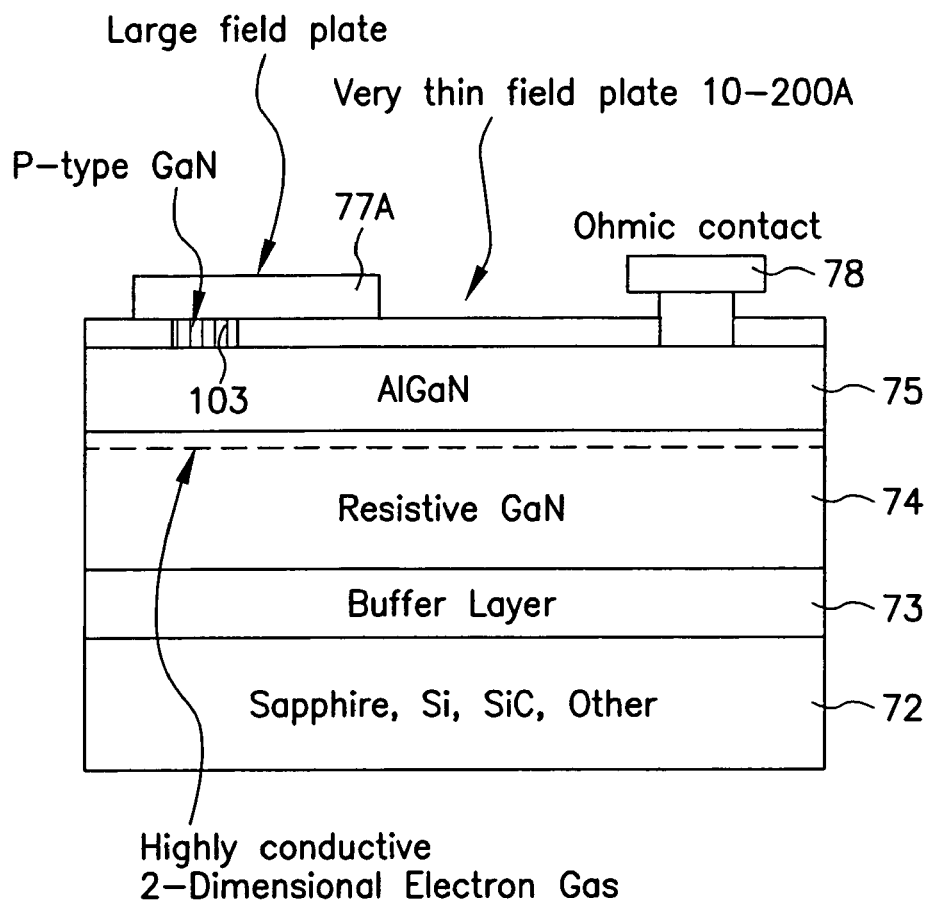
FIG. 10 is another variation of a device according to FIG. 7.

Referring now to FIG. 10, the schottky portion 77B of the device shown in FIG. 7 can be replaced with P-type GaN body 103. P-Type GaN body 103 can be contained within opening 101 or could extend out over the insulator if it is, for example, created through regrowth.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A current control III-nitride device, comprising:
   a conduction channel that includes a two-dimensional electron gas (2DEG) formed at an interface between two III-nitride materials having different in-plane lattice constants or different band gaps wherein one of the two III-nitride materials is an electron supply layer for said 2DEG, said 2DEG including a region of reduced density;
   a first electrode making a schottky contact to said electron supply layer and disposed over the region of reduced density;
   a second electrode in ohmic contact with said electron supply layer adjacent said first electrode; and
   a third electrode in ohmic contact with said electron supply layer, wherein the first electrode overlies the third electrode;
   said current control III-nitride device configured to carry current between said second electrode and said third electrode when said third electrode is forward biased and block current when reverse biased compared to said second electrode.

2. The device of claim 1, wherein the two III-nitride materials are composed of GaN and AlGaN, respectively, with the first, second, and third electrodes being formed on the AlGaN.

3. The device of claim 1, further comprising a sapphire substrate.

4. The device of claim 1, further comprising a silicon substrate.

5. The device of claim 1, further comprising a SiC substrate.

6. The device of claim 1, further comprising a III-nitride buffer layer, wherein the two III-nitride materials reside on the III-nitride buffer layer.

7. A current control III-nitride device, comprising:
   a conduction channel that includes a two-dimensional electron gas (2DEG) formed at an interface between two III-nitride materials having different in-plane lattice constants or different band gaps wherein one of the two III-nitride materials is an electron supply layer for said 2DEG, said 2DEG including a region of reduced density;
   a first electrode disposed over the region of reduced density;
   a second electrode in ohmic contact with said electron supply layer adjacent said first electrode; and a third electrode in ohmic contact with said electron supply layer and in contact with the first electrode;

said current control III-nitride device configured to carry current between said second electrode and said third electrode when said third electrode is forward biased and block current when reverse biased compared to said second electrode.

8. The device of claim 7, further comprising a recess under the first electrode in said electron supply layer.

9. The device of claim 7, wherein said first electrode is a schottky electrode coupled to said electron supply layer.

10. The device of claim 7, wherein said two III-nitride materials are composed of GaN and AlGaN, respectively, with said first, second, and third electrodes being formed over said AlGaN.

11. The device of claim 7, further comprising a III-nitride buffer layer, wherein said two III-nitride materials reside on said III-nitride buffer layer.

12. The device of claim 7, further comprising a sapphire substrate.

13. The device of claim 7, further comprising a silicon substrate.

14. The device of claim 7, further comprising a SiC substrate.

* * * * *